United States Patent
Liu et al.

(10) Patent No.: US 11,626,885 B1
(45) Date of Patent: Apr. 11, 2023

(54) GAIN PROGRAMMABILITY TECHNIQUES FOR DELTA-SIGMA ANALOG-TO-DIGITAL CONVERTER

(71) Applicant: Analog Devices, Inc., Wilmington, MA (US)

(72) Inventors: Shaolong Liu, Cambridge, MA (US); Daniel Peter Canniff, Brookline, MA (US); Abhishek Bandyopadhyay, Winchester, MA (US); Akira Shikata, Chelsea, MA (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 17/538,187

(22) Filed: Nov. 30, 2021

(51) Int. Cl.
  *H03M 3/00* (2006.01)
  *H03M 1/00* (2006.01)
  *H03M 1/06* (2006.01)
  *H03M 1/12* (2006.01)

(52) U.S. Cl.
  CPC .............. *H03M 3/37* (2013.01); *H03M 3/454* (2013.01); *H03M 1/00* (2013.01); *H03M 1/06* (2013.01); *H03M 1/12* (2013.01); *H03M 3/00* (2013.01)

(58) Field of Classification Search
  CPC .......... H03M 3/00; H03M 3/37; H03M 3/454; H03M 1/06; H03M 1/00; H03M 1/12
  See application file for complete search history.

(56) References Cited

U.S. PATENT DOCUMENTS

| | | |
|---|---|---|
| 6,414,615 B1 | 7/2002 | Cheng |
| 6,642,759 B1 | 11/2003 | Hughes |
| 6,941,116 B2 | 9/2005 | Jensen et al. |
| 7,453,296 B2 | 11/2008 | Masenas |
| 8,319,674 B2 | 11/2012 | Loeda et al. |
| 9,322,863 B2 | 4/2016 | Cormier, Jr. |
| 9,325,341 B2 | 4/2016 | Dagher et al. |
| 9,385,740 B2 | 7/2016 | Wang et al. |
| 9,455,737 B1 | 9/2016 | Rajaee et al. |
| 9,577,662 B2 | 2/2017 | Wei et al. |
| 9,871,534 B2 | 1/2018 | Tsai et al. |

(Continued)

FOREIGN PATENT DOCUMENTS

| | | |
|---|---|---|
| CN | 109818620 A | 5/2019 |
| JP | 2008209997 | 9/2008 |

(Continued)

OTHER PUBLICATIONS

Liberti, Anselmo Gianluca, "Suppressing voltage glitches in SiC MOSFETs", PCIM Europe 2019, Nuremberg, Germany, (May 7-9, 2019), 7 pgs.

(Continued)

*Primary Examiner* — Joseph J Lauture

(74) *Attorney, Agent, or Firm* — Schwegman Lundberg & Woessner, P.A.

(57) ABSTRACT

An excess loop delay compensation (ELDC) technique for use with a successive approximation register (SAR) based quantizer in a continuous time delta-sigma ADC is described. The techniques can efficiently program and calibrate the ELD gain in ELD compensation SAR quantizers. An ELDC circuit can include a charge pump having a digitally programmable capacitance to adjust a gain, such as the gain of the ELDC digital-to-analog converter (DAC) or the gain of the SAR DAC.

20 Claims, 9 Drawing Sheets

(56) References Cited

U.S. PATENT DOCUMENTS

| | | |
|---|---|---|
| 10,243,578 B2 | 3/2019 | Dagher et al. |
| 10,345,418 B2 | 7/2019 | Wadell et al. |
| 10,541,706 B2 | 1/2020 | Erol et al. |
| 10,749,544 B2 | 8/2020 | Kauffman et al. |
| 10,778,212 B1 | 9/2020 | DAquino et al. |
| 10,886,937 B1 * | 1/2021 | Bandyopadhyay ... H03M 3/422 |
| 2018/0219558 A1 | 8/2018 | Chiu et al. |
| 2020/0011928 A1 | 1/2020 | Mücke et al. |

FOREIGN PATENT DOCUMENTS

| | | |
|---|---|---|
| WO | WO-2021061885 A1 | 4/2021 |
| WO | 2021173638 | 9/2021 |

OTHER PUBLICATIONS

Mauromicale, Giuseppe, "Improvement of SiC power module layout to mitigate the gate-source overvoltage during switching operation", 2019 AEIT International Conference of Electrical and Electronic Technologies for Automotive (AEIT Automotive), IEEE, (2019), 6 pgs.

* cited by examiner

US 11,626,885 B1

GAIN PROGRAMMABILITY TECHNIQUES FOR DELTA-SIGMA ANALOG-TO-DIGITAL CONVERTER

FIELD OF THE DISCLOSURE

This document pertains generally, but not by way of limitation, to digital-to-analog conversion, and more particularly to delta-sigma converter circuits.

BACKGROUND

An analog-to-digital converter (ADC) circuit can be used to convert an analog signal to a digital signal, which can then be further processed or used in the digital domain. Continuous-time (CT) Delta-Sigma (DS) ADCs are good at precision and low power applications and can use successive approximation register (SAR) ADCs as quantizers to reduce power.

A SAR ADC circuit can carry out bit trials to compare portions of the analog signal to a reference voltage to determine the digital bit values of a digital word representing a particular sample of the analog signal. A SAR ADC can use a capacitor array of a digital-to-analog converter (DAC) for carrying out the bit trials for determining the respective digital bit values of the digital word.

SAR ADCs can be desirable because they require low power. However, the successive nature of the conversion means that the conversion can be relatively slow and excess loop delay compensation (ELDC) DACs are commonly used in addition to the DACs of the SAR ADC to compensate for the delay introduced by the SAR conversion when the SAR ADC is used as a quantizer in a DS ADC.

SUMMARY OF THE DISCLOSURE

This disclosure is directed to an excess loop delay compensation (ELDC) technique for use with a successive approximation register (SAR) based quantizer in a continuous time delta-sigma ADC. The techniques can efficiently program and calibrate the ELD gain in ELD compensation SAR quantizers. Using various techniques of this disclosure, an ELDC circuit can include a charge pump having a digitally programmable capacitance to adjust a gain, such as the gain of the ELDC digital-to-analog converter (DAC) or the gain of the SAR DAC.

In some aspects, this disclosure is directed to a successive approximation register (SAR) analog-to-digital converter (ADC) to convert an analog input signal to a digital output signal, the SAR ADC comprising: a sampling switch connected to an input, the input to receive the analog input signal; a SAR digital-to-analog converter (DAC) coupled to the sampling switch, the SAR DAC including a first set of capacitors controlled by a SAR control signal; and an excess loop delay compensation (ELDC) circuit coupled to the SAR DAC by a summing node, the ELDC circuit including: an ELDC DAC including a second set of capacitors controlled by an ELDC control signal; a charge pump coupled to either the first set of capacitors or the second set of capacitors, the charge pump having a programmable capacitance to adjust a gain; and a logic circuit to: generate the SAR control signal and the ELDC control signal; and generate the digital output signal.

In some aspects, this disclosure is directed to a method of operating a successive approximation register (SAR) analog-to-digital converter (ADC) to convert a received analog input signal to a digital output signal, the method comprising: coupling a charge pump of an excess loop delay compensation (ELDC) circuit to either a first set of capacitors of a SAR digital-to-analog converter (DAC) or a second set of capacitors of an ELDC DAC of the ELDC circuit, wherein the ELDC circuit is coupled to the SAR DAC by a summing node, and wherein the charge pump has a programmable capacitance to adjust a gain; generating a SAR control signal and a ELDC control signal to control the first set of capacitors and the second set of capacitors, respectively; and generating the digital output signal.

In some aspects, this disclosure is directed to a delta-sigma analog-to-digital converter (ADC) circuit to receive an analog input signal at an input and generate a digital output signal, the delta-sigma analog-to-digital converter circuit comprising: an input summing node configured to receive and combine the analog input signal and an output of a digital-to-analog converter circuit; and a successive approximation register (SAR) ADC to receive a representation of the combined analog input signal and output of the digital-to-analog converter circuit, the SAR ADC comprising: a SAR digital-to-analog converter (DAC) coupled to a sampling switch, the SAR DAC including a first set of capacitors controlled by a SAR control signal; and an excess loop delay compensation (ELDC) circuit coupled to the SAR DAC by a summing node, the ELDC circuit including: an ELDC DAC including a second set of capacitors controlled by an ELDC control signal; and a charge pump coupled to either the first set of capacitors or the second set of capacitors, the charge pump having a programmable capacitance to adjust a gain; and a logic circuit to: generate the SAR control signal and the ELDC control signal, and generate the digital output signal.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Continuous-time (CT) delta-sigma (DS) analog-to-digital converters (ADCs) are good at precision and low power applications and can use SAR ADCs as quantizers to further reduce power. As noted in the background above, successive approximation register (SAR) ADCs can be desirable as quantizers in CTDS ADCs because they require low power. However, the successive nature of the SAR conversion means that the conversion can be relatively slow. As a result, excess loop delay compensation (ELDC) digital-to-analog converters (DACs) are commonly used in addition to the DACs of the SAR ADC when SAR ADCs are used as quantizers in CTDS ADCs to compensate for the delay introduced by the SAR conversion.

This disclosure describes an excess loop delay compensation (ELDC) technique for use with a successive approximation register (SAR) based quantizer in a continuous time delta-sigma ADC. The techniques can efficiently program and calibrate the ELD gain in ELD compensation SAR quantizers. Using various techniques of this disclosure, an ELDC circuit can include a charge pump having a digitally programmable capacitance to adjust a gain, such as the gain of the ELDC digital-to-analog converter (DAC) or the gain of the SAR DAC.

Figure 1:
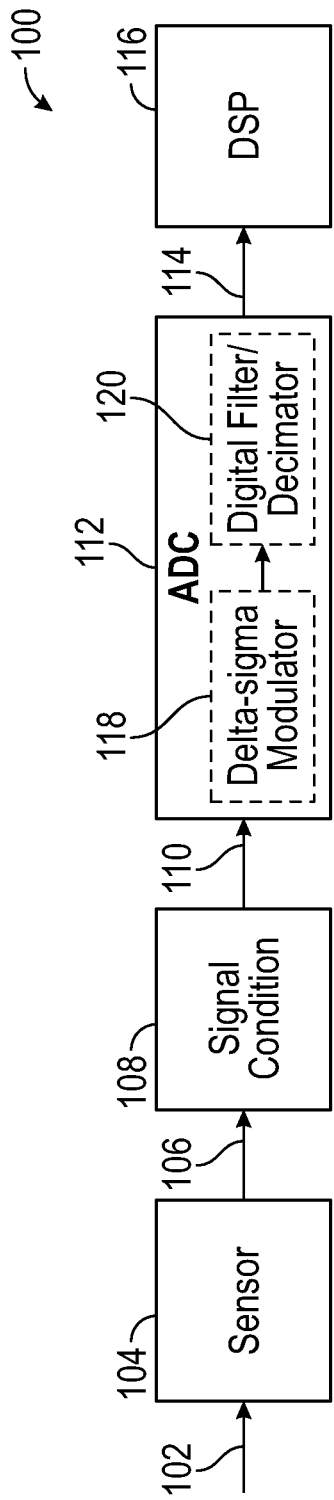
FIG. 1 is a schematic block diagram of an example of a data acquisition system that can implement a delta-sigma modulator.

FIG. 1 is a schematic block diagram of an example of a data acquisition system 100, which can implement a delta-sigma modulator. The data acquisition system 100 can be an electronic device (including an electronic circuit and/or one or more components) configured to convert signals (such as analog signals) into a usable form. In various implementations, the data acquisition system 100 can convert physical conditions into digital form, which can be stored and/or analyzed. FIG. 1 has been simplified for the sake of clarity. Additional features can be added in the data acquisition system 100, and some of the features described can be replaced or eliminated in other embodiments of the data acquisition system 100.

In FIG. 1, the data acquisition system 100 can include an input signal 102 that represents a physical condition, such as (but not limited to) temperature, pressure, sound, velocity, flow rate, position, other physical condition, or combination thereof. A sensor circuit 104 can receive an input signal 102 and convert the physical condition (represented by input signal 102) into an electrical signal, such as an analog signal 106. The analog signal 106 can be a voltage or current that represents the physical condition (represented by the input signal 102).

A signal conditioning circuit 108 can receive and adjust the analog signal 106 within an acceptable range of an analog-to-digital converter (ADC), providing a conditioned analog signal 110. The conditioned analog signal 110 can be provided at ADC circuit 112, such that the signal conditioning circuit 108 can act as an interface between the sensor circuit 104 and the ADC circuit 112, the conditioning analog signal 106 (and thus providing the conditioned analog signal 110) before the ADC circuit 112 digitizes the analog signal. The signal conditioning circuit 108 can amplify, attenuate, filter, and/or perform other conditioning functions to the analog signal 106. The ADC circuit 112 can receive and convert the conditioned analog signal 110 into digital form, providing a digital signal 114. The digital signal 114 can represent the physical quantity received by the sensor via the input signal 102. A digital signal processor (DSP) circuit 116 can receive and process digital signal 114.

The ADC circuit 112 can include a delta-sigma ADC that generates a digital signal using a feedback technique, where the delta-sigma ADC can oversample its input signal (here, the conditioned analog signal 110) and perform noise-shaping to achieve a high-resolution digital signal (here, the digital signal 114). The delta-sigma ADC can include a delta-sigma modulator 118 and a digital filter/decimator 120. The delta-sigma modulator 118 can use oversampling (for example, a sampling rate above Nyquist rate) and filtering to generate a digital signal that represents the input signal received by the delta-sigma ADC (such as the conditioned analog signal 110).

In various implementations, the delta-sigma ADC feedback loop forces the output of the modulator to be a good representation of the input signal in the bandwidth of interest. The digital filter/decimator 120 can attenuate noise and/or slow a data rate (for example, to a Nyquist sampling rate) of the digital signal, providing the digital signal 114. The digital filter/decimator 120 can include a digital filter, a decimator, or both. The digital filter can attenuate the digital signal received from the delta-sigma modulator 118, and the decimator can reduce a sampling rate of the digital signal received from the delta-sigma modulator 118.

Figure 2:
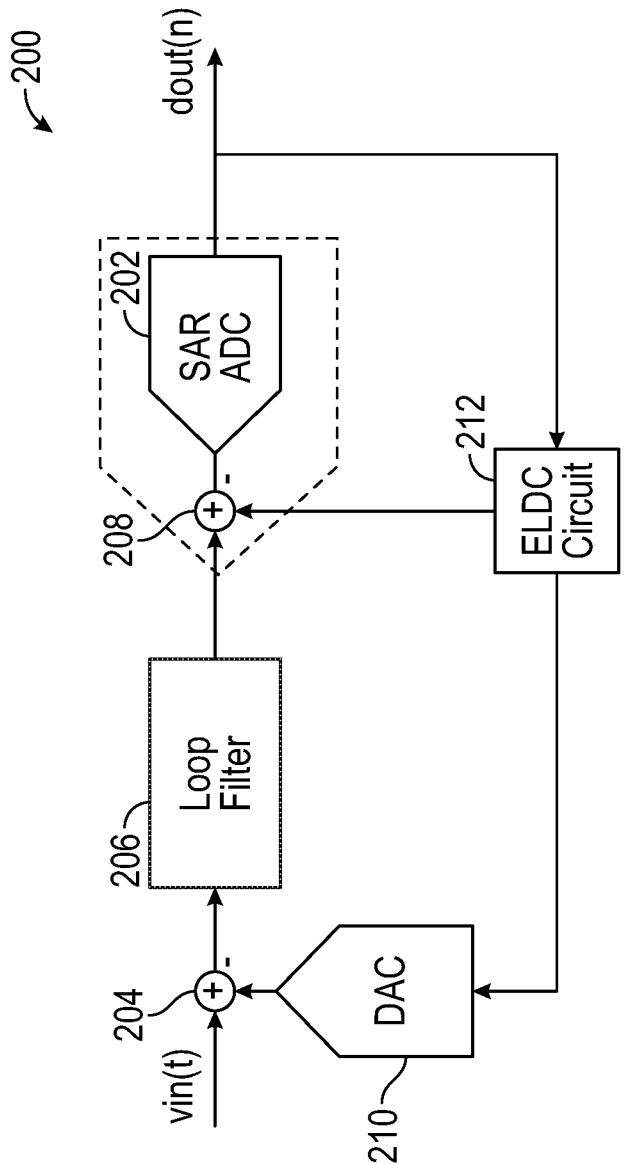
FIG. 2 is a functional block diagram of an example of a continuous-time delta sigma analog-to-digital converter (ADC) including a successive approximation register (SAR) ADC circuit.

FIG. 2 is a functional block diagram of an example of a CTDS ADC 200 including a SAR ADC circuit 202. The CTDS ADC 200 can be an example of the delta-sigma modulator 118 of FIG. 1. The CTDS ADC 200 can convert an analog input signal Vin(t) into a digital output signal dout(n), which can include a continuous serial stream of ones and zeros at a rate determined by a sampling clock frequency. It will be appreciated that, in some implementations, a discrete-time (DT) delta-sigma (DS) ADC can also be used.

The SAR ADC circuit 202 is a type of ADC that converts a continuous analog waveform into a discrete digital representation via a binary search through various possible quantization levels before converging on an output for each conversion. The SAR ADC circuit 202 can include a sample and hold circuit to acquire the input voltage. An analog voltage comparator can compare the input voltage to the output of a DAC of the SAR ADC and output the result of the comparison to a SAR logic circuit having a sub-circuit that supplies an approximate digital reference code to the DAC of the SAR ADC. The DAC of the SAR ADC can convert the digital reference code to a voltage reference and supply the comparator with an analog voltage equal to the digital reference code output by the SAR ADC.

During operation, the SAR ADC can be initialized so that the most significant bit (MSB) is equal to a reset or center value, which is fed into the DAC of the SAR ADC, which then supplies the analog equivalent of this digital code (0) into the comparator circuit for comparison with the sampled input voltage. If this analog voltage exceeds the input voltage, the comparator causes the SAR ADC to reset this bit; otherwise, the bit remains as 1. The next bit is set to 1 and the same test is done. This binary search continues until every bit in the SAR has been tested. The resulting code is the digital approximation of the sampled input voltage against input full scale range of +/−Vref and is output by the SAR at the end of the conversion. A detailed explanation of a SAR ADC is provided in commonly assigned U.S. Pat. No. 10,886,937 to Bandyopadhyay et al., the entire contents of which being incorporated herein by reference.

As shown in FIG. 2, an input analog voltage Vin(t) is applied to an input summing node 204 coupled to an input of a loop filter circuit 206. The loop filter circuit 206 can perform operations typical for CTDS ADCs, such as filtering, such as to produce characteristic noise shaping of a delta-sigma modulator. The loop filter circuit 206 can include one or more integrator circuit stages, depending on design requirements. The input summing node 204 can be implemented as the summing node of an operational amplifier (op amp), such as the op amp of an integrator of the loop filter circuit 206.

One or more integrators of the loop filter circuit 206 can integrate the output of the input summing node 204. The output of the loop filter circuit 206 can be applied to a summing node 208 that is coupled to an input of the SAR ADC circuit 202. The digital output signal dout(n) of the SAR ADC circuit 202 (and the CTDS ADC 200) can be applied to a digital filter and decimator, such as the digital filter/decimator 120 of FIG. 1, that averages every M cycles, where M is a positive integer greater than 1. The decimator reduces the effective sampling rate at the output.

The CTDS ADC 200 can further include a DAC 210 provided in a feedback path. The DAC 210 can generate an analog signal representing the digital output signal dout(n), which can be applied to the input summing node 204. The input summing node 204 can output an analog signal representing a difference between the analog input signal vin(t) and the output of the DAC 210, which can be input to the loop filter circuit 206.

To compensate for conversion delay error introduced by the SAR ADC circuit 202, an ELDC circuit 230 can be provided to feedback delayed versions of the output of the SAR ADC circuit 202 to add to the output of the loop filter circuit 206 at summing node 208. In particular, the ELDC circuit 212 can function to feedback an amplified or an attenuated version of the previous output code of the SAR ADC circuit 202 for loop stability.

ELD compensation, which is basically a fast feedback path with a DAC and an adder around a quantizer to compensate the loop response error caused by quantizer delay, can be an important design consideration in CTDS ADCs as it can impact the noise transfer function (NTF) and the stability of the modulator. SAR ADC based quantizers have become more and more popular than their Flash ADC counterparts in CTDS ADCs, due to their power-efficiency and scalability with technology and supply. Also, because of the presence of a capacitive DAC (C-DAC) in the SAR ADC quantizer, the ELD DAC can be conveniently embedded to the SAR C-DAC and the analog adder can be saved because the addition can be completed by the charge redistribution in the C-DAC.

This integration of the SAR quantizer and ELD compensation can save significant power and area. However, because the constituent unit capacitors in the C-DAC are usually in the sub-femtofarad (If) or fF scale, which is the very reason for the high power and area efficiency, it can become challenging to program the gain of the ELD path, which is determined by the capacitance ratio of the ELDC-DAC unit to the SAR C-DAC unit or ($C_{SAR}/C_{ELD}$). However, the post-silicon processing or NTF restoration from errors caused by PVT variations requires flexibility in changing ELD gain.

In some approaches with an explicit ELD DAC and adder, the ELD gain can be programmed by changing the DAC gain (e.g., unit current in current DAC implementations) or the adder coefficient for the ELD path. As described in more detail below, this disclosure describes an excess loop delay compensation (ELDC) technique for use with a SAR-based quantizer in a CTDS ADC, such as the CTDS ADC 200 of FIG. 2. The techniques can efficiently program and calibrate the ELD gain in ELD compensation SAR quantizers. Using various techniques, an ELDC circuit can include a charge pump having a digitally programmable capacitance to adjust a gain, such as the gain of the ELDC digital-to-analog converter (DAC) or the gain of the SAR DAC.

As described below, a charge pump having a capacitance CX can be used to share the charge sampled at the ELD C-DAC, CELD, during the sampling phase. During the conversion phase, the charge pump is disconnected from the ELD C-DAC taking away a fraction of the total ELD charge, and the remaining charge on ELD C-DAC can then participate in charge redistribution with the charge on the SAR C-DAC for the quantization. Because the capacitance CX can be reset before each charge sharing operation, the remaining charge on the ELD C-DAC is proportional to CELD/(CELD+CX). Therefore, by changing the capacitance CX through switches and capacitors, the gain of the ELD path can be conveniently programmed.

Also, the changing range and precision can be determined by the range and step size of CX, respectively. Using a 6-bit SAR as a non-limiting example, with CELD=63CELD unit capacitor, by changing CX from 0 to 63 CELD unit capacitor, the ELD gain range can be changed by 50%, with a step of less than about 2%. Also, because the ELD gain can be digitally controlled, these techniques can support the application case where ELD gain changes from cycle to cycle. In addition, the ELD gain with any CX settings can be self-calibrated by using the existing SAR quantizer. This can be done by disconnecting the quantizer inputs, breaking the ELD feedback, and setting the ELD input (digital) to full scale and letting the SAR quantize the attenuated ELD signal. The ELD gain can be found by the ratio of the quantizer output to the ELD input.

Figure 3:
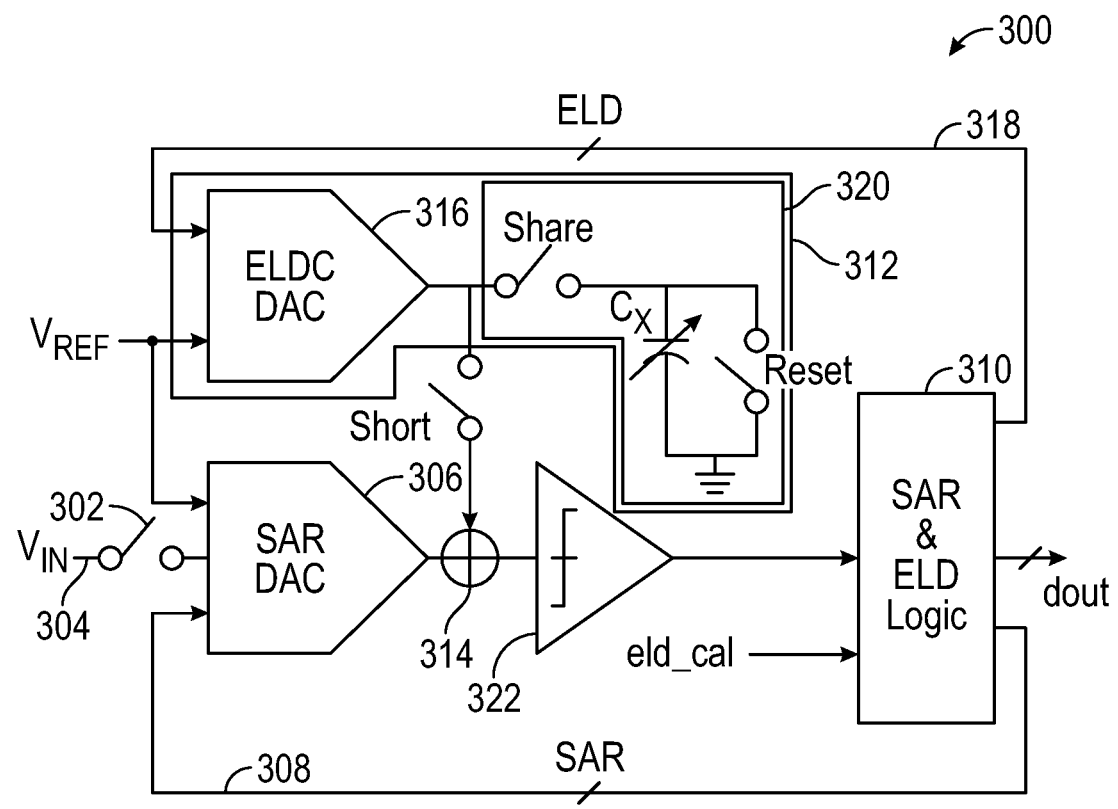
FIG. 3 is a functional block diagram of an example of a SAR ADC that can implement various techniques of this disclosure.

FIG. 3 is a functional block diagram of an example of a successive approximation register (SAR) analog-to-digital converter (ADC) that can implement various techniques of this disclosure. The SAR ADC circuit 300 is an example of the SAR ADC circuit 202 of FIG. 2 and can convert an analog input signal VIN to a digital output signal dout.

The SAR ADC circuit 300 can include a sampling switch 302 connected to an input 304, where the input 304 is configured to receive the analog input signal VIN. The SAR ADC circuit 300 can include a SAR DAC 306 coupled to the sampling switch 302. The SAR DAC can include a set of capacitors (shown below in FIG. 4) controlled by a SAR control signal ("SAR") 308 generated by a SAR and ELD logic circuit 310.

The SAR ADC circuit 300 can further include an excess loop delay compensation (ELDC) ELDC circuit 312 coupled to the SAR DAC 306 by a summing node 314. The ELDC circuit 312 can include an ELDC DAC 316 that has a set of capacitors (shown in FIG. 4) controlled by an ELDC control signal ("ELD") 318. In addition, the ELDC circuit 312 can include a charge pump 320 coupled to the set of capacitors of the ELDC DAC 316 and having a programmable capacitance to adjust a gain of the ELDC DAC 316. In some examples, the ELDC circuit 312 can be embedded in the SAR ADC circuit 300. That is, the ELDC circuit 312 can be closely integrated with the SAR ADC circuit 300, e.g., such that they can both apply charge onto the same summing node for quantization.

Charge from the ELDC DAC 316 can be combined with charge from the SAR DAC 306 at the summing node 314 and provided as a voltage to an input of a comparator circuit 322. The comparator circuit 322 can compare the analog voltage supplied by the summing node 314 to an analog equivalent of a digital code during a bit trial. If the analog equivalent of the digital code exceeds the analog voltage supplied by the summing node 314, the comparator circuit 322 can cause the SAR ADC to reset this bit; otherwise, the bit remains as 1. The next bit is set to 1 and the same test is repeated. The output of the comparator circuit 322 is applied to the SAR and ELD logic circuit 310. The SAR and ELD logic circuit 310 can generate the SAR control signal 308 and the ELDC control signal 318, and can generate the digital output signal dout.

Figure 4:
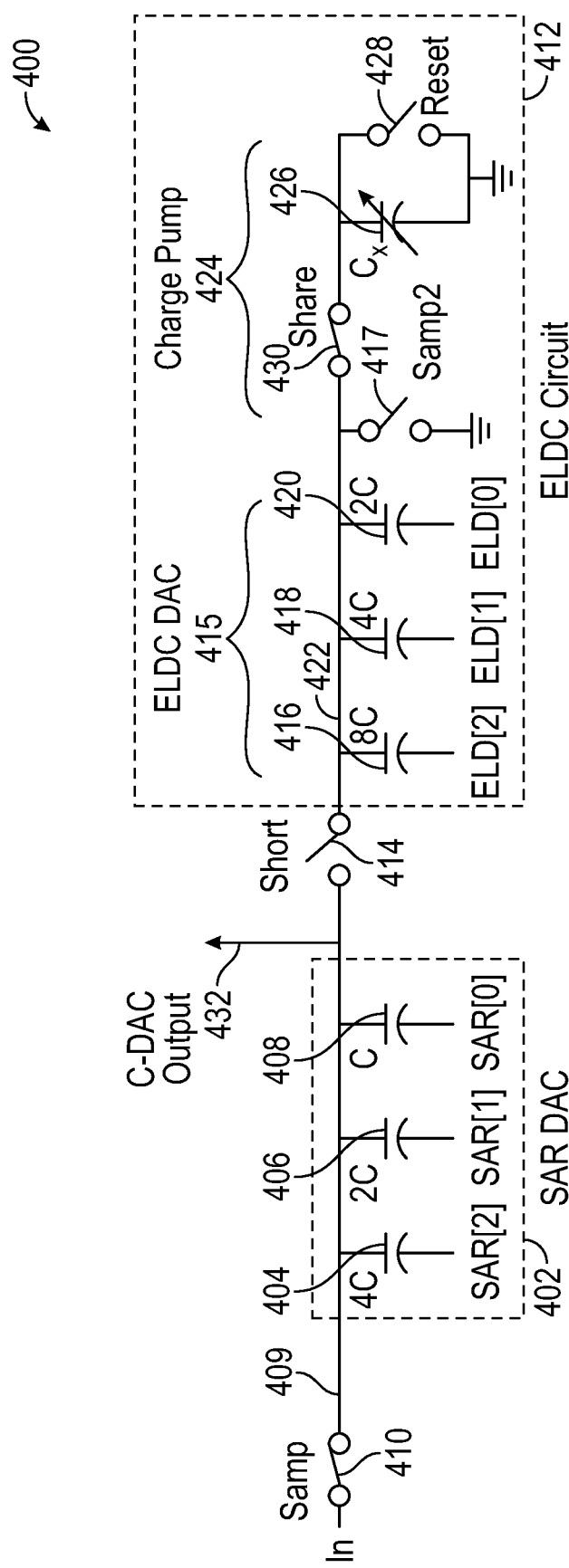
FIG. 4 depicts an example of a capacitive digital-to-analog converter (DAC) structure for a SAR ADC that includes a SAR DAC and an ELDC circuit that includes an ELDC DAC and a charge pump, in accordance with various techniques of this disclosure.

FIG. 4 depicts an example of a capacitive DAC structure for a SAR ADC 400 that includes a SAR DAC and an ELDC circuit that includes an ELDC DAC and a charge pump, in accordance with various techniques of this disclosure. Although the example shown in FIG. 4 is a 3-bit example for purposes of illustration, the techniques of this disclosure are not limited to 3-bits.

The SAR DAC 402 can include a set of capacitors 404-408, e.g., binary weighted capacitors, such as having weights of 4C, 2C, and C. In some examples, each of the capacitors 404-408 can include a corresponding "top plate" and a "bottom plate", without reference to a particular spatial orientation.

The SAR DAC 402 can be controlled by a SAR control signal, such as the SAR control signal 308 of FIG. 3. As shown in FIG. 4, the example of a SAR control signal can include a 3-bit control signal of SAR[2], SAR[1], and SAR[0] to control switches coupled to capacitors 404-408 that can couple the corresponding bottom plates of the capacitors 404-408 to either a first reference voltage to represent a bit value of zero [0] or a second reference voltage to represent a bit value of one [1]. The top plates of the capacitors 404-408 are coupled together at a node 409.

The portion of the SAR ADC 400 shown can include a sampling switch 410 ("samp") connected to an input "in", where the input can receive an analog input signal. The SAR DAC 402 can be coupled to the sampling switch 410. In addition, the SAR DAC 402 can be coupled to the ELDC circuit 412, such as by a shorting switch 414 ("short").

The ELDC circuit 412, which is an example of the ELDC circuit 312 of FIG. 3, can include an ELDC DAC 415 that includes a set of capacitors 416-420, e.g., binary weighted capacitors, such as having weights of 8C, 4C, and 2C, to store the ELDC sampled charge, which is a charge representing a previous sample of the SAR ADC. In some examples, each of the capacitors 416-420 can include a corresponding "top plate" and a "bottom plate", without reference to a particular spatial orientation.

The ELDC DAC 415 can store the ELDC sampled charge when the ELDC sampling switch 417 ("samp2") is closed. The ELDC DAC 415 can be controlled by an ELDC control signal, such as the ELDC control signal 318 of FIG. 3. As shown in FIG. 4, the example of an ELDC control signal can include a 3-bit control signal of ELD[2], ELD[1], and ELD[0] to control switches coupled to capacitors 416-420 that can couple the corresponding bottom plates of the capacitors 416-420 to either a first reference voltage to represent a bit value of zero [0] or a second reference voltage to represent a bit value of one [1]. The top plates of the capacitors 416-420 can be coupled together at a node 422.

The ELDC circuit 412 can include a charge pump 424 coupled to the set of capacitors 416-420 of the ELDC DAC 415. ELDC gain programmability can be implemented by the charge pump 424. That is, the charge pump 424 can include a programmable capacitance 426, represented in FIG. 4 as having a capacitance of CX, to adjust a gain of the ELDC DAC 415. The charge pump 424 can further include a reset switch 428 ("reset") and a charge sharing switch 430 ("share"). An example of a charge pump 424 is shown in more detail in FIG. 9.

The charge pump capacitance CX can provide a programmable attenuation factor to the ELDC sampled charge. The remaining ELDC charge can then participate in charge redistribution with the SAR DAC, thereby providing excess loop delay compensation at the capacitive DAC output 432, which is coupled to an input of a comparator circuit, such as the comparator circuit 322. If the charge pump capacitance CX is digitally controlled and composed of multiple unit capacitors, the tuning resolution will be <1/2N for an N-bit SAR. In some examples, the charge pump capacitance CX can be set once based on a design target, such as from simulations and/or silicon performance, and does not change based on the ELDC control signal codes received during normal operation.

In the non-limiting example shown in FIG. 4, the ELDC DAC 415 has a capacitance $C_{ELD}$ (14C) that is twice the capacitance $C_{SAR}$ (7C) of the SAR DAC 402 ($C_{ELD}=2.0C_{SAR}$) to provide a maximum ELDC gain of 2.0×. In other implementations, the maximum ELDC gain can be more or less than 2.0×.

Figure 8:
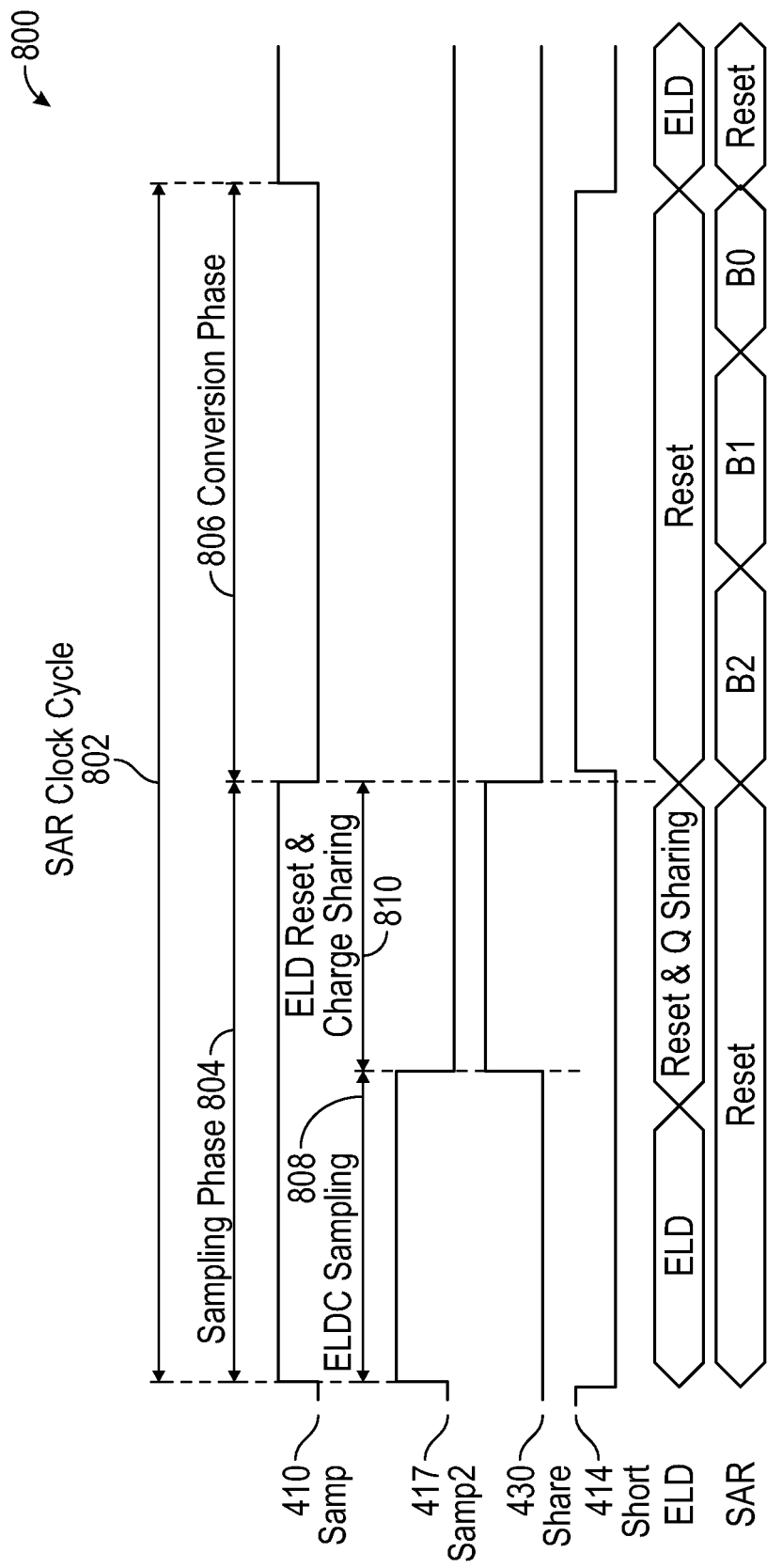
FIG. 8 is an example of a timing diagram that can be used to operate the capacitive DAC structure of FIG. 4, in accordance with various techniques of this disclosure.

The capacitive DAC structure of FIG. 4 can be operated using a SAR clock cycle that includes a sampling phase and a conversion phase. The sampling phase or the conversion phase can include an attenuation phase. The capacitive DAC structure of FIG. 4 is shown in the sampling phase in FIG. 5, the attenuation phase is shown in FIG. 6, the conversion phase is shown in FIG. 8, and a corresponding timing diagram is shown in FIG. 8.

Figure 5:
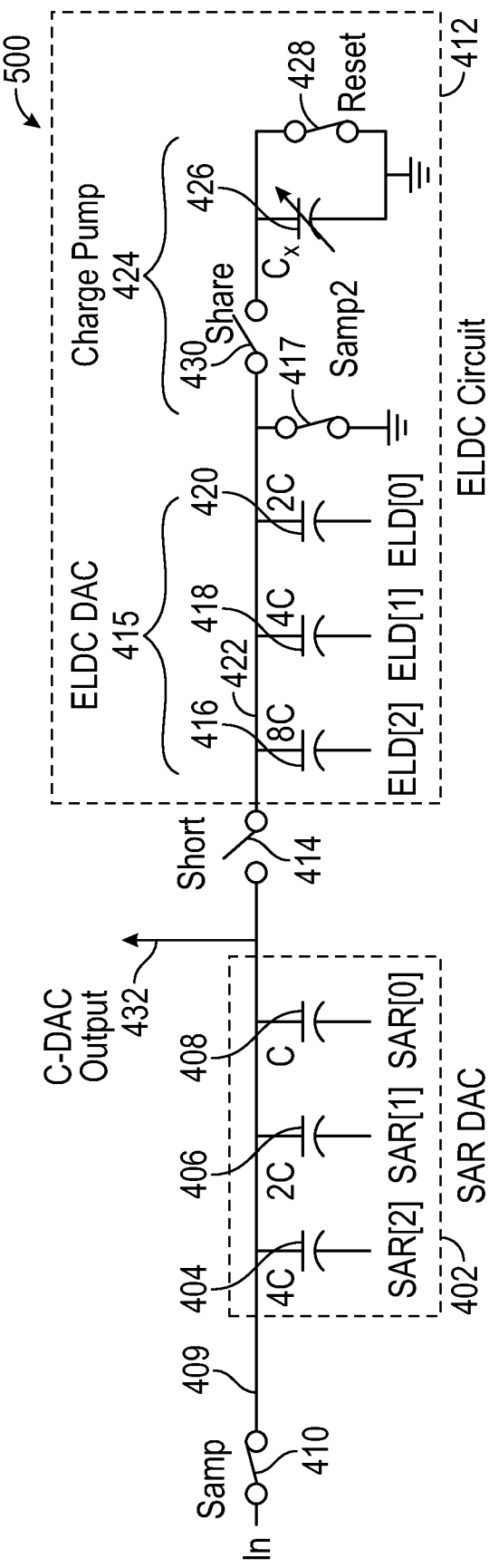
FIG. 5 depicts an example of the capacitive DAC structure of FIG. 4 in a sampling phase, in accordance with various techniques of this disclosure.

FIG. 5 depicts an example of the capacitive DAC structure of FIG. 4 in a sampling phase, in accordance with various techniques of this disclosure. In the sampling phase 500, the SAR and ELD logic circuit, such the SAR and ELD logic circuit 310 of FIG. 3, can control operation of the various switches. The sampling switch 410 is closed and the SAR DAC 402 can track the quantizer input. In addition, the reset switch 428 of the charge pump 424 is closed, which resets the voltage of the charge pump 424 to a DC voltage, such as ground in the example shown. The ELDC sampling switch 417 is closed such that the ELDC DAC 415 samples the ELDC charge by using an ELD control signal ELD[2:0]. In the sampling phase 500, both the shorting switch 414 and the charge sharing switch 430 are open.

Figure 6:
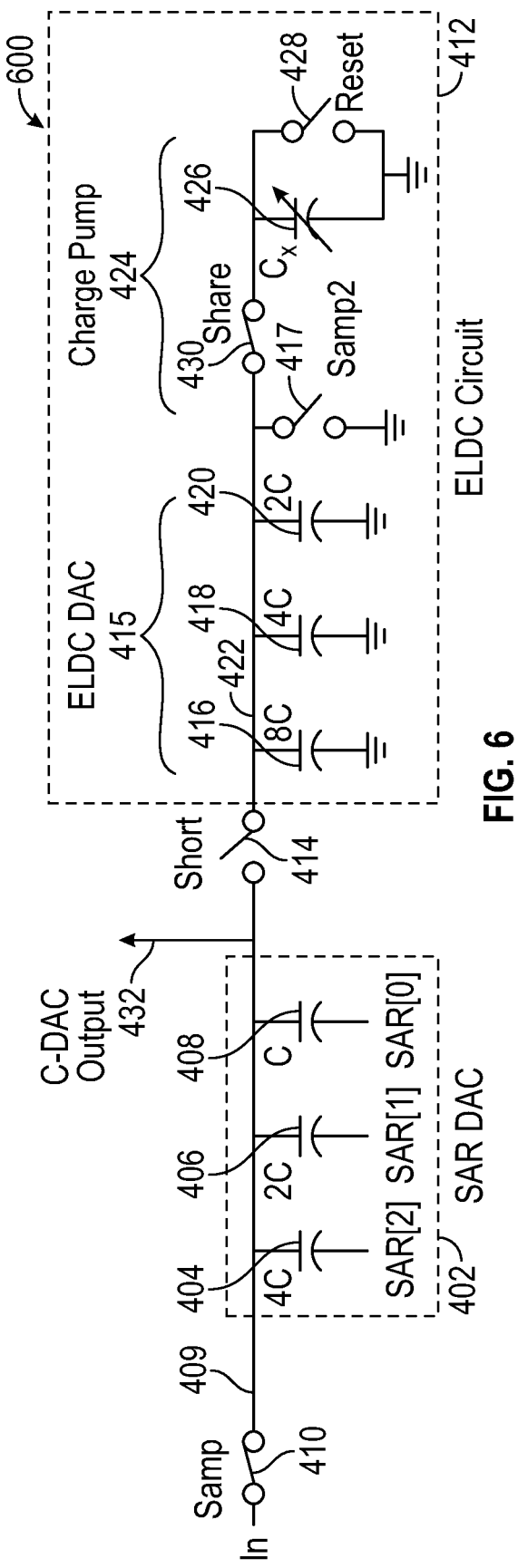
FIG. 6 depicts an example of the capacitive DAC structure of FIG. 4 in an attenuation phase, in accordance with various techniques of this disclosure.

FIG. 6 depicts an example of the capacitive DAC structure of FIG. 4 in an attenuation phase, in accordance with various techniques of this disclosure. The attenuation phase can be part of either the sampling phase or the conversion phase. When the attenuation phase is part of the sampling phase, a configuration such as shown in FIG. 6 can be used. In the attenuation phase 600 shown in FIG. 6, the SAR and ELD logic circuit can control operation of the various switches.

The sampling switch 410 can remain closed such that the SAR DAC 402 can track and sample the quantizer input. The SAR and ELD logic circuit can control the ELDC sampling switch 417 to open and can control switches coupled to the bottom plates of the set of capacitors 416-420 of the ELDC DAC 316 to connect to a DC voltage, such as ground in the example shown, to restore the ELDC voltage on the top plates of the set of capacitors 416-420, which are coupled to node 422.

In addition, the reset switch 428 of the charge pump 424 is opened and the charge sharing switch 430 is closed. In this manner, the set of capacitors 416-420 of the ELDC DAC 415 share the ELDC charge on node 422 with the charge pump capacitance CX, so the charge on the set of capacitors 416-420 of the ELDC DAC 415 is attenuated. That is, the SAR and ELD logic circuit 310 can control switch operation to combine a charge of the charge pump 424 with a charge of the set of capacitors 416-420 of the ELDC DAC 415 to attenuate the charge of the set of capacitors 416-420. In some examples, the logic circuit can control switch operation to combine the charge of the charge pump 424 with the charge on the top plates of the set of capacitors 416-420 to attenuate the charge of the set of capacitors 416-420.

In the non-limiting example of the attenuation phase shown in FIG. 6, there is a voltage of (14C)×(the ELD control signal ELD[2:0]) on the top plates of the set of capacitors 416-420 of the ELDC DAC 415, or at node 422. The charge pump capacitance CX does not take any charge during the attenuation phase because it was reset before the charge sharing switch 430 was closed. If CX=2C, as a non-limiting example, then the actual gain is 2×(ELD control signal ELD[2:0])×(14/16) after the attenuation phase, where the 2× gain factor is based on the assumption that $C_{ELD}=2.0C_{SAR}$.

Figure 7:
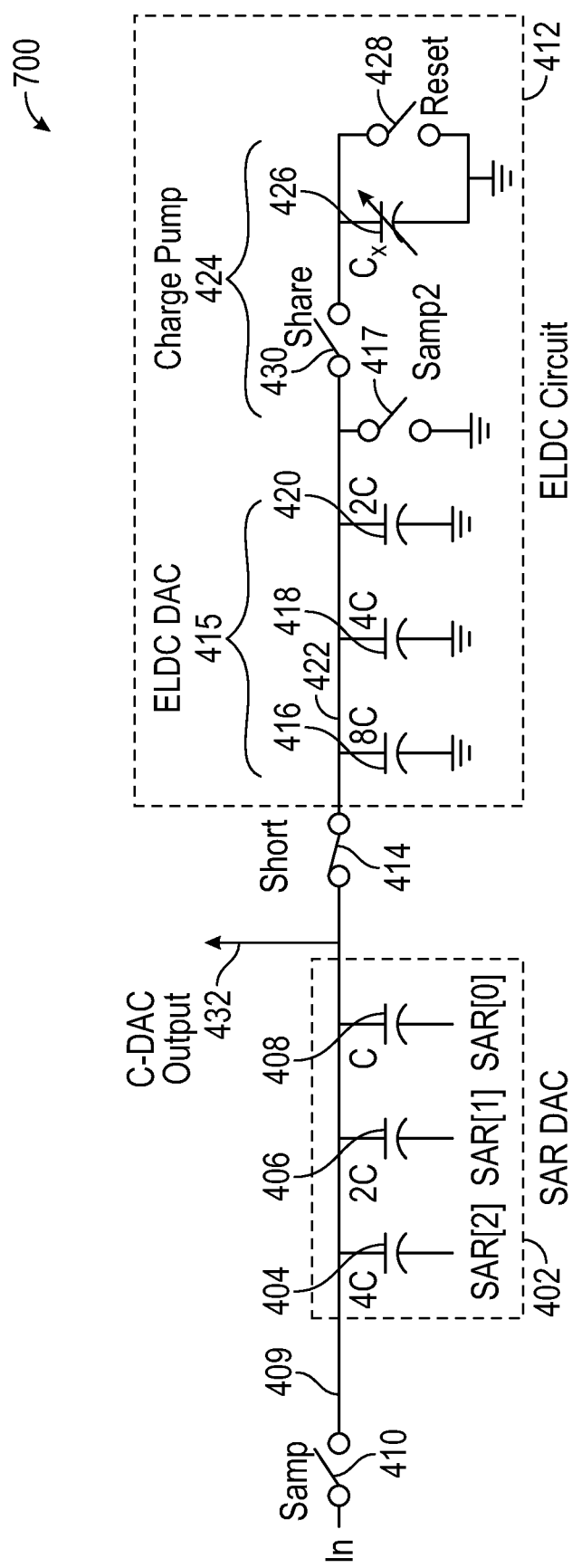
FIG. 7 depicts an example of the capacitive DAC structure of FIG. 4 in a conversion phase, in accordance with various techniques of this disclosure.

FIG. 7 depicts an example of the capacitive DAC structure of FIG. 4 in a conversion phase, in accordance with various techniques of this disclosure. The conversion phase 700 follows the sampling phase 500 of FIG. 5. In the conversion phase 700 shown in FIG. 7, the SAR and ELD logic circuit can control operation of the various switches. When the SAR and ELD logic circuit opens the sampling switch, the analog input signal is sampled onto the set of capacitors 404-408. In the conversion phase, both the sampling switch 410 and the charge sharing switch 430 are open.

In the conversion phase 700, the charge pump 424 has taken away a portion of the ELDC charge and is then disconnected from the ELDC DAC 415 by opening the charge sharing switch 430. In addition, the SAR and ELD logic circuit can control the shorting switch 414 to close, which couples the set of capacitors 404-408 of the SAR DAC 402 with the set of capacitors 416-420 of the ELDC DAC 415, thereby combining a charge of the set of capacitors 404-408 that represents the sampled analog input signal with the previously combined charge of the charge pump 424 and charge of the set of capacitors 416-420 of the ELDC DAC 415 to generate a subsequent combination of charge. The SAR and ELD logic circuit can control the SAR DAC and the ELDC DAC to perform a number of bit-trials of a conversion on the subsequent combination of charge. In this manner, the charge from the capacitors 416-420 of the ELDC DAC 415 can be merged with the charge from the set of capacitors 404-408 of the SAR DAC 402 to participate in the SAR binary search and charge redistribution.

In the non-limiting example shown in FIG. 6, the analog input signal can be sampled using the 7C capacitance of the set of capacitors 404-418 of the SAR DAC 402. The gain controlled ELD control signal can be applied using the 14C capacitance of the set of capacitors 416-420 of the ELD DAC 415. In the conversion phase, the voltage of (7C)×(sampled analog signal) is summed with (14C)×(ELD control signal), which is charge that has been modified by the charge pump. In this manner, the sampled analog signal is attenuated by a factor of 1/3 and the ELD control signal is attenuated by factor of 2/3.

FIG. 8 is an example of a timing diagram that can be used to operate the capacitive DAC structure of FIG. 4, in accordance with various techniques of this disclosure. The timing diagram 800 depicts operation of the sampling switch 410 ("samp"), the ELDC sampling switch 417 ("samp2"), the charge sharing switch 430 ("share"), and the shorting switch 414 ("short"). The timing diagram 800 further depicts an ELD control signal ("ELD"), such as the ELD control signal 318 of FIG. 3, and a SAR control signal ("SAR", such as the SAR control signal 308 of FIG. 3.

The SAR clock cycle 802 can include a sampling phase 804 and a conversion phase 806. The sampling phase 804 can include two portions: an ELDC sampling portion 808 and an ELD reset and charge sharing portion 810. The ELD reset and charge sharing portion 810 is also referred to as the attenuation phase, which is shown and described above with respect to FIG. 6.

Figure 9:
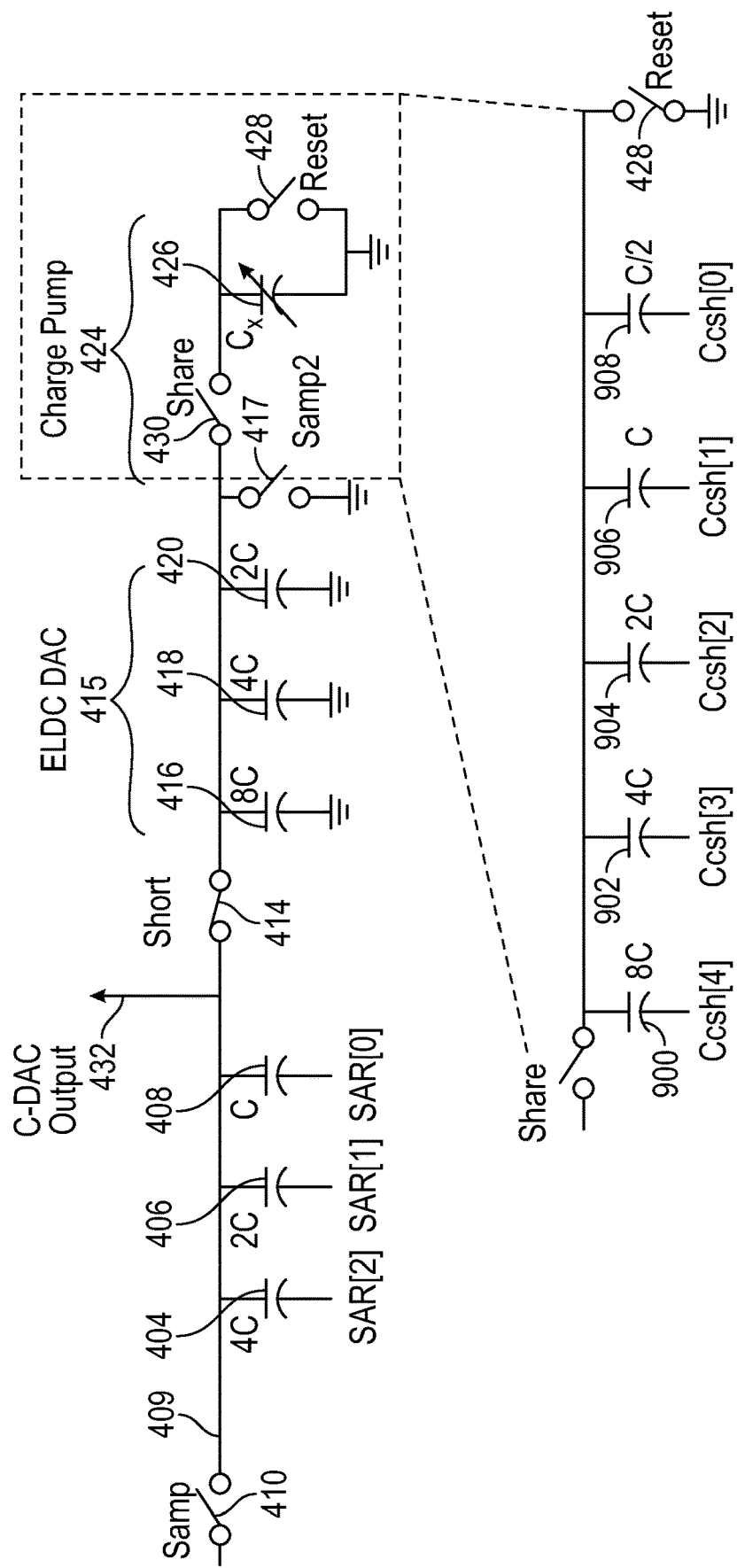
FIG. 9 depicts an example of the charge pump of FIG. 4 in more detail.

FIG. 9 depicts an example of the charge pump of FIG. 4 in more detail. In the example shown, the charge pump 424 can receive a 5-bit charge pump code Ccsh[4:0] that can control switches coupled to the bottom plates of various capacitors, e.g., unit capacitors. The 5-bit charge pump code Ccsh[4:0] can control capacitors 900-908, respectively. In the example shown, the capacitors 900-908 can have capacitances of 8C, 4C, 2C, C, and C/2.

As mentioned above, in some examples, the charge pump capacitance CX can be set once based on a design target, such as from simulations and/or silicon performance, and does not change based on the ELDC control signal codes received during normal operation. In order to determine the charge pump capacitance CX, and thus the charge pump code, such as the 5-bit charge pump code Ccsh[4:0] of FIG. 9, the SAR ADC circuit can perform a calibration technique, such as shown in FIGS. 10 and 11.

Figure 10:
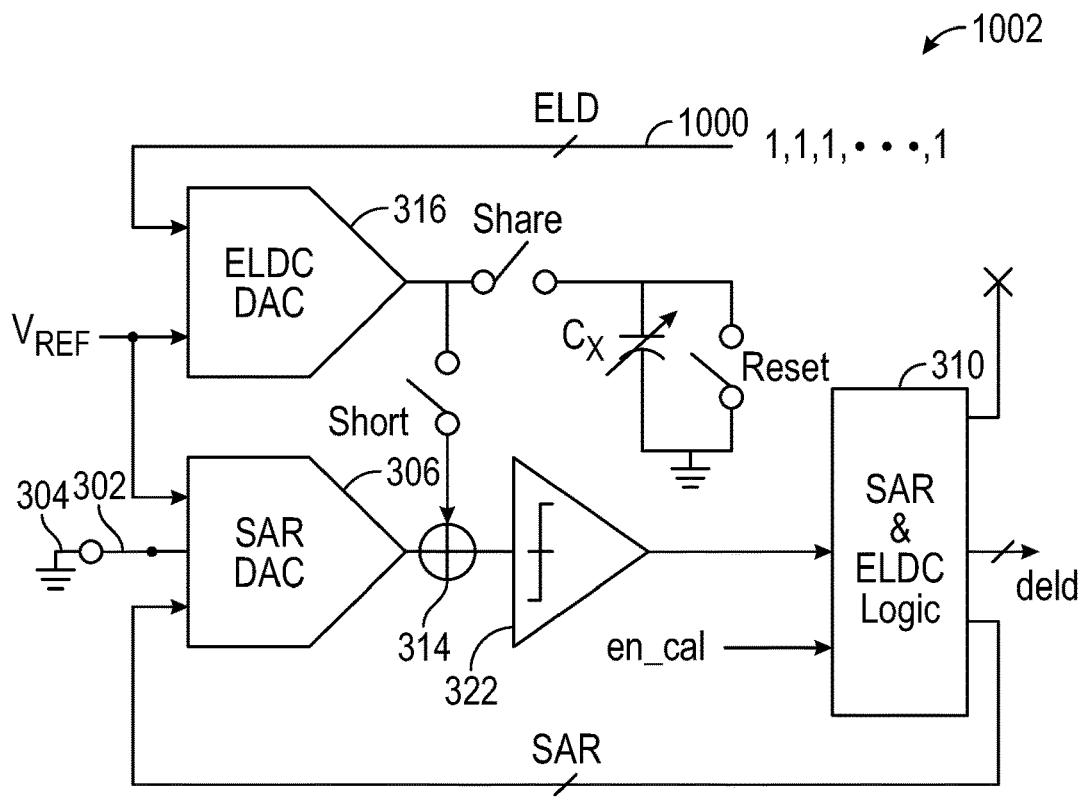
FIG. 10 depicts an example of a calibration technique of the SAR ADC circuit of FIG. 3.
Figure 11:
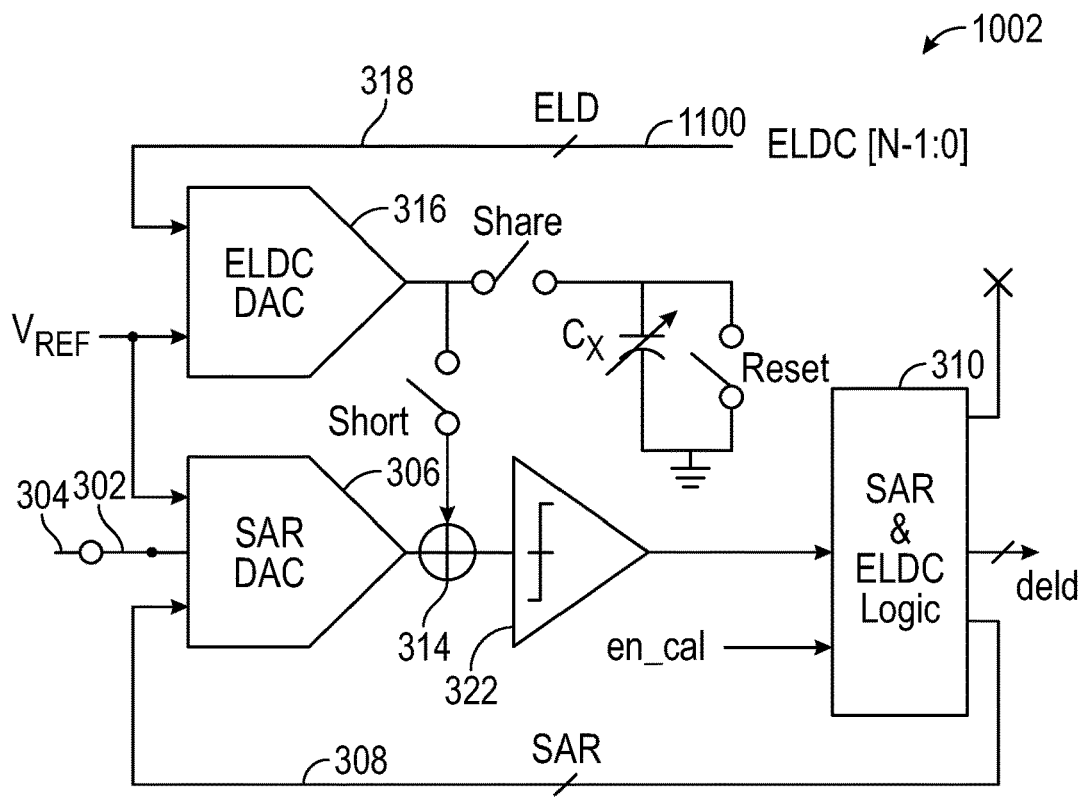
FIG. 11 depicts another example of a calibration technique of the SAR ADC circuit of FIG. 3.

FIG. 10 depicts an example of a calibration technique of the SAR ADC circuit of FIG. 3. In FIG. 10, a single point calibration method is depicted. First, a calibration enable signal ("en_cal") can be applied to the SAR and ELD logic circuit 310. In response, the quantizer inputs can be shorted, such as by using the SAR and ELD logic circuit 310 to close the sampling switch 302 and shorting the input 304 to ground. In addition, the ELD feedback loop 1000 can be broken, such as by opening a switch. Next, the SAR and ELD logic circuit 310 can apply an ELDC control signal 318 having a maximum code [1, 1, 1, 1, ..., 1] and, in response, the SAR ADC circuit 1002 can begin operating normally.

Because the input of the SAR ADC circuit 1002 is 0 (the input is grounded), the output signal ("deld") of the SAR ADC circuit 1002 is a scaled digital representation of the ELDC charge, which can be represented using Equation 1 below:

$$G_{ELD} = \frac{deld}{2^{N-1}} \cdot \frac{2^N}{2^N - 1} \quad \text{Equation 1}$$

where $G_{ELD}$ represents the gain of the ELDC DAC 316 and N is the number of bits of the SAR ADC circuit 1002. The charge pump capacitance control code, such as the control code Ccsh[4:0] of FIG. 9, can be adjusted until the desired ELDC gain $G_{ELD}$ is achieved. The determined code can then be applied in normal operation mode.

FIG. 11 depicts another example of a calibration technique of the SAR ADC circuit of FIG. 3. A two-point calibration method is depicted in FIG. 11. First, a calibration enable signal ("en_cal") can be applied to the SAR and ELD logic circuit 310. In response, an input reference voltage V1 within the SAR ADC circuit input range, including 0V, can be applied to the quantizer inputs, such as by using the SAR and ELD logic circuit 310 to close the sampling switch 302. In addition, the ELD feedback loop 1100 can be broken, such as by opening a switch.

Next, the SAR and ELD logic circuit 310 can apply an ELDC control signal 318 having a first code and, in response, the SAR ADC circuit 1002 can begin operating normally. The SAR and ELD logic circuit 310 can store the output signal ("deld") as SAR code d1 (or "first ELD digital output calibration signal").

The SAR and ELD logic circuit 310 can apply an ELDC control signal 318 having a second code and, in response, the SAR ADC circuit 1002 can begin operating normally. The SAR and ELD logic circuit 310 can store the output signal ("deld") as SAR code d2 (or "second ELD digital output calibration signal").

Because the input of the SAR ADC circuit 1102 is still at the reference voltage V1, the SAR code d2 of the SAR ADC circuit 1002 is a scaled digital representation of the ELDC charge plus the input reference voltage V1, which can be represented using Equation 2 below:

$$G_{ELD} = \frac{d2 - d1}{2^{N-1}} \cdot \frac{2^N}{2^N - 1} \quad \text{Equation 2}$$

where $G_{ELD}$ represents the gain of the ELDC DAC 316, N is the number of bits of the SAR ADC circuit 1102, SAR code d1 is the output of the SAR ADC circuit using the ELDC control signal 318 having a first code, and SAR code d2 is the output of the SAR ADC circuit using the ELDC control signal 318 having a second code.

The charge pump capacitance control code, such as the control code Ccsh[4:0] of FIG. 9, can be adjusted until the desired ELDC gain $G_{ELD}$ is achieved. The determined code can then be applied in normal operation mode. In some examples, the first code can be a minimum code [0, 0, 0, 0, . . . , 0] and the second code can be a maximum code [1, 1, 1, 1, . . . , 1] but the techniques of FIG. 11 are applicable to any two points and not limited to use of a minimum and a maximum.

Using the techniques of FIG. 11, the SAR and ELD logic circuit 310 can receive a calibration signal and, in response, control switch operation to determine, with the analog input signal set to a reference voltage, e.g., reference voltage V1, a first ELD digital output calibration signal, e.g., SAR code d1, where the ELDC control signal is set to a first code value, and a second ELD digital output calibration signal, e.g., SAR code d2, where the ELDC control signal is set to a second code value. Then, the SAR and ELD logic circuit 310 can determine a charge pump control code, e.g., Ccsh[4:0] of FIG. 9, based on the first ELD digital output calibration signal, e.g., SAR code d1, and the second ELD digital output calibration signal, e.g., SAR code d2, where the charge pump control code programs the capacitance of the charge pump.

In the example shown in FIG. 3, the ELDC circuit 312 can include a charge pump 320 coupled to the set of capacitors of the ELDC DAC 316. In other examples, such as shown in FIG. 12, the charge pump can be coupled to the set of capacitors of the SAR DAC 306.

Figure 12:
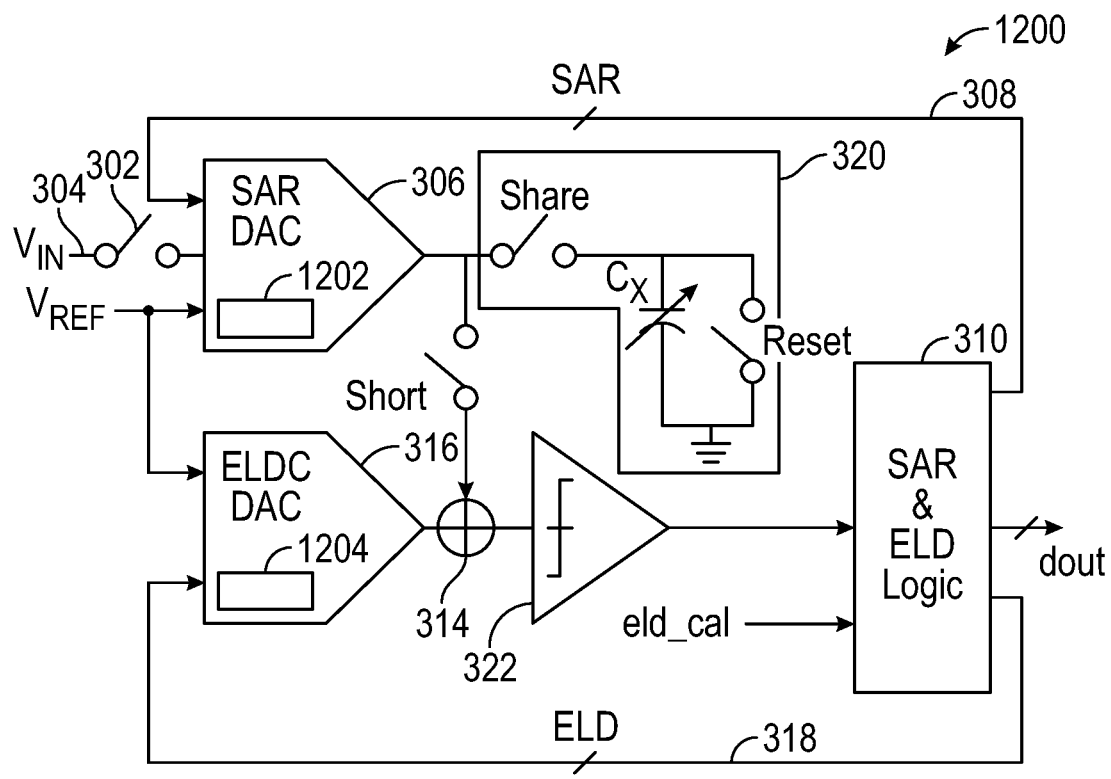
FIG. 12 is a functional block diagram of another example of a SAR ADC that can implement various techniques of this disclosure.

FIG. 12 is a functional block diagram of another example of a SAR ADC that can implement various techniques of this disclosure. The SAR ADC circuit 1200 is an example of the SAR ADC circuit 202 of FIG. 2 and can convert an analog input signal VIN to a digital output signal dout. Many of the aspects of FIG. 12 are similar to those shown in FIG. 3 and, as such, will not be described in detail again, for purposes of conciseness.

The SAR DAC 306 can include a set of capacitors 1202 and the ELDC DAC 316 can include a set of capacitors 1204, like in FIG. 3. In contrast to FIG. 3, the charge pump 320 of the SAR ADC circuit 1200 of FIG. 12 is coupled to the set of capacitors 1202 in the SAR DAC 306 rather than to the set of capacitors 1204 in the ELDC DAC 316. The charge pump 320 has a programmable capacitance to adjust a gain of the SAR DAC 306. The SAR and ELD logic circuit 310 can generate the SAR control signal and the ELDC control signal, and the SAR and ELD logic circuit 310 can generate the digital output signal.

The techniques of this disclosure provide both a wide tuning range and high precision. ELD gain calculation $G_{ELD}$ is shown below in Equation 3:

$$G_{ELD} = \frac{k_{attenuate} C_{ELD}}{C_{SAR}} = \frac{C_{ELD}}{C_{SAR}} \times \frac{C_{ELD}}{C_{ELD} + C_X} = G_{ELD,max} \frac{1}{1 + C_X / C_{ELD}} \quad \text{Equation 3}$$

where $C_{ELD}$ is the capacitance of the ELD DAC, such as the ELD DAC 415 of FIG. 4, where $C_{SAR}$ is the capacitance of the SAR DAC, such as the SAR DAC 402 of FIG. 4, and Cx is the capacitance of the charge pump, such as the charge pump 424 of FIG. 4. In Equation 3, the term represents the gain between the ELD and SAR capacitances and the term $$\frac{C_{ELD}}{C_{ELD} + C_X}$$

represents the attenuation added due to the capacitance Cx of the charge pump. As the capacitance Cx increases relative to $C_{ELD}$, the term Cx/$C_{ELD}$ increases and the term $$\frac{1}{1 + C_X / C_{ELD}}$$

decreases. In this manner, the techniques can provide a wide tuning range for the attenuation based on the value of programmable the capacitance Cx.

High ELD gain precision can be achieved with the techniques of this disclosure by using a multi-bit charge pump code, such as the 5-bit charge pump code Ccsh[4:0] of FIG. 9. Other implementations can include a charge pump code with more than 5 bits or less than 5 bits. Increasing the number of bits in the charge pump code can increase the number of steps in the tuning range and decrease the step size, thereby increasing the precision.

Figure 13:
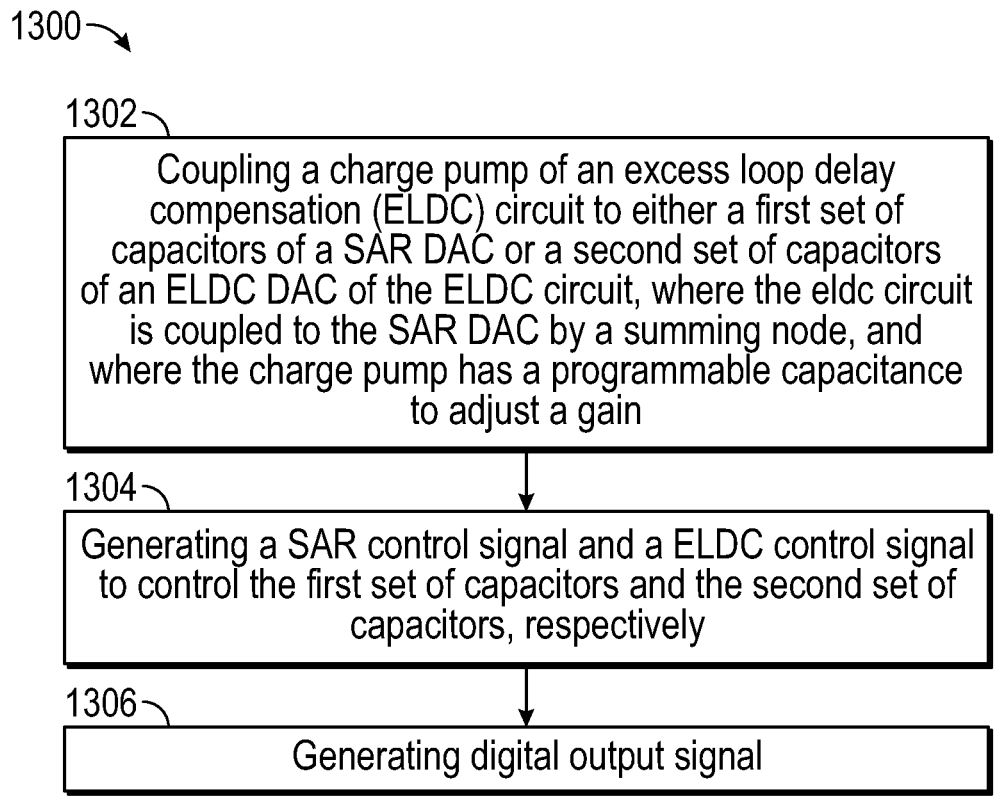
FIG. 13 is a flow diagram of an example of a method of operating a successive approximation register (SAR) analog-to-digital converter (ADC) to convert a received analog input signal to a digital output signal.

FIG. 13 is a flow diagram of an example of a method 1300 of operating a successive approximation register (SAR) analog-to-digital converter (ADC) to convert a received analog input signal to a digital output signal. At block 1302, the method can include coupling a charge pump of an excess loop delay compensation (ELDC) circuit to either a first set of capacitors of a SAR digital-to-analog converter (DAC) or a second set of capacitors of an ELDC DAC of the ELDC circuit, where the ELDC circuit is coupled to the SAR DAC by a summing node, and where the charge pump has a programmable capacitance to adjust a gain. For example, the SAR ADC circuit 300 of FIG. 3 includes an ELDC circuit 312 with a charge pump 320 coupled to a set of capacitors in the ELDC DAC 316, such as capacitors 416-420 of FIG. 4. As another example, the SAR ADC circuit 300 of FIG. 12 includes an ELDC circuit 312 with a charge pump 320 coupled to a set of capacitors 1202 in the SAR DAC 306.

At block 1304, the method can include generating a SAR control signal and an ELDC control signal to control the first set of capacitors and the second set of capacitors, respectively. For example, the SAR and ELD logic circuit 310 of FIG. 3 can generate a SAR control signal 308 to control capacitors 416-420 of FIG. 4 and an ELDC control signal 318 to control capacitors 416-420 of FIG. 4.

At block 1306, the method can include generating the digital output signal, such as the digital output signal dout of FIG. 3.

In some examples, the method can include coupling the charge pump to the second set of capacitors, and wherein the programmable capacitance adjusts the gain of the ELDC DAC. In some examples, the method can include controlling switch operation to combine a charge of the charge pump with a charge of the second set of capacitors to attenuate the charge of the second set of capacitors.

In some examples, capacitors of the first set of capacitors have corresponding top plates and bottom plates, and capacitors of the second set of capacitors have corresponding top plates and bottom plates, and the method can include controlling switch operation to combine the charge of the charge pump with the charge on the top plates of the second set of capacitors to attenuate the charge of the second set of capacitors.

In some examples, the method can include controlling switch operation during the conversion phase to combine a charge of the first set of capacitors that represents a sampled analog input signal with the previously combined charge of the charge pump and charge of the second set of capacitors to generate a subsequent combination of charge, and controlling the SAR DAC and the ELDC DAC to perform a number of bit-trials of a conversion on the subsequent combination of charge.

In some examples, the method can include receiving a calibration signal and, in response, controlling switch operation to determine, with the analog input signal set to a reference voltage, a first ELD digital output calibration signal where the ELDC control signal is set to a first code value, and a second ELD digital output calibration signal where the ELDC control signal is set to a second code value, and determine a charge pump control code based on the first ELD digital output calibration signal and the second ELD digital output calibration signal, wherein the charge pump control code programs the capacitance of the charge pump.

In some examples, the method can include coupling the charge pump to the first set of capacitors, and wherein the programmable capacitance adjusts the gain of the SAR DAC.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. A successive approximation register (SAR) analog-to-digital converter (ADC) to convert an analog input signal to a digital output signal, the SAR ADC comprising:
   a sampling switch connected to an input, the input to receive the analog input signal;
   a SAR digital-to-analog converter (DAC) coupled to the sampling switch, the SAR DAC including a first set of capacitors controlled by a SAR control signal; and
   an excess loop delay compensation (ELDC) circuit coupled to the SAR DAC by a summing node, the ELDC circuit including:
      an ELDC DAC including a second set of capacitors controlled by an ELDC control signal;
      a charge pump coupled to either the first set of capacitors or the second set of capacitors, the charge pump having a programmable capacitance to adjust a gain; and
   a logic circuit to:
      generate the SAR control signal and the ELDC control signal; and
      generate the digital output signal.

2. The SAR ADC of claim 1, wherein the charge pump is coupled to the second set of capacitors, and wherein the programmable capacitance adjusts the gain of the ELDC DAC.

3. The SAR ADC of claim 2, wherein the logic circuit is configured to control switch operation to:
   combine a charge of the charge pump with a charge of the second set of capacitors to attenuate the charge of the second set of capacitors.

4. The SAR ADC of claim 3, wherein capacitors of the first set of capacitors have corresponding top plates and bottom plates, wherein capacitors of the second set of capacitors have corresponding top plates and bottom plates, the logic circuit to control switch operation to:
   combine the charge of the charge pump with the charge on the top plates of the second set of capacitors to attenuate the charge of the second set of capacitors.

5. The SAR ADC of claim 3, comprising:
   the logic circuit to control switch operation during a conversion phase to:
      combine a charge of the first set of capacitors that represents a sampled analog input signal with the combined charge of the charge pump and charge of the second set of capacitors to generate a subsequent combination of charge; and
   control the SAR DAC and the ELDC DAC to perform a number of bit-trials of a conversion on the subsequent combination of charge.

6. The SAR ADC of claim 1, the logic circuit to receive a calibration signal and, in response, control switch operation to:
   determine, with the analog input signal set to a reference voltage, a first ELD digital output calibration signal where the ELDC control signal is set to a first code value, and a second ELD digital output calibration signal where the ELDC control signal is set to a second code value; and
   determine a charge pump control code based on the first ELD digital output calibration signal and the second ELD digital output calibration signal, wherein the charge pump control code programs the capacitance of the charge pump.

7. The SAR ADC of claim 1, wherein the charge pump is coupled to the first set of capacitors, and wherein the programmable capacitance adjusts the gain of the SAR DAC.

8. A method of operating a successive approximation register (SAR) analog-to-digital converter (ADC) to convert a received analog input signal to a digital output signal, the method comprising:
   coupling a charge pump of an excess loop delay compensation (ELDC) circuit to either a first set of capacitors of a SAR digital-to-analog converter (DAC) or a second set of capacitors of an ELDC DAC of the ELDC circuit, wherein the ELDC circuit is coupled to the SAR DAC by a summing node, and wherein the charge pump has a programmable capacitance to adjust a gain;
   generating a SAR control signal and a ELDC control signal to control the first set of capacitors and the second set of capacitors, respectively; and
   generating the digital output signal.

9. The method of claim 8, comprising:
   coupling the charge pump to the second set of capacitors, and wherein the programmable capacitance adjusts the gain of the ELDC DAC.

10. The method of claim 9, comprising:
    controlling switch operation to combine a charge of the charge pump with a charge of the second set of capacitors to attenuate the charge of the second set of capacitors.

11. The method of claim 10, wherein capacitors of the first set of capacitors have corresponding top plates and bottom plates, wherein capacitors of the second set of capacitors have corresponding top plates and bottom plates, the method comprising:
    controlling switch operation to combine the charge of the charge pump with the charge on the top plates of the second set of capacitors to attenuate the charge of the second set of capacitors.

12. The method of claim 10, comprising:
    controlling switch operation during a conversion phase to combine a charge of the first set of capacitors that represents a sampled analog input signal with the combined charge of the charge pump and charge of the second set of capacitors to generate a subsequent combination of charge; and controlling the SAR DAC and the ELDC DAC to perform a number of bit-trials of a conversion on the subsequent combination of charge.

13. The method of claim 8, comprising:
receiving a calibration signal and, in response, controlling switch operation to:
   determine, with the analog input signal set to a reference voltage, a first ELD digital output calibration signal where the ELDC control signal is set to a first code value, and a second ELD digital output calibration signal where the ELDC control signal is set to a second code value; and
   determine a charge pump control code based on the first ELD digital output calibration signal and the second ELD digital output calibration signal, wherein the charge pump control code programs the capacitance of the charge pump.

14. The method of claim 8, comprising:
coupling the charge pump to the first set of capacitors, and wherein the programmable capacitance adjusts the gain of the SAR DAC.

15. A delta-sigma analog-to-digital converter (ADC) circuit to receive an analog input signal at an input and generate a digital output signal, the delta-sigma analog-to-digital converter circuit comprising:
   an input summing node configured to receive and combine the analog input signal and an output of a digital-to-analog converter circuit; and
   a successive approximation register (SAR) ADC to receive a representation of the combined analog input signal and output of the digital-to-analog converter circuit, the SAR ADC comprising:
      a SAR digital-to-analog converter (DAC) coupled to a sampling switch, the SAR DAC including a first set of capacitors controlled by a SAR control signal; and
      an excess loop delay compensation (ELDC) circuit coupled to the SAR DAC by a summing node, the ELDC circuit including:
         an ELDC DAC including a second set of capacitors controlled by an ELDC control signal; and
         a charge pump coupled to either the first set of capacitors or the second set of capacitors, the charge pump having a programmable capacitance to adjust a gain; and
      a logic circuit to:
         generate the SAR control signal and the ELDC control signal; and
         generate the digital output signal.

16. The delta-sigma ADC of claim 15, wherein the charge pump is coupled to the second set of capacitors, and wherein the programmable capacitance adjusts the gain of the ELDC DAC.

17. The delta-sigma ADC of claim 16, wherein the logic circuit is configured to control switch operation to:
   combine a charge of the charge pump with a charge of the second set of capacitors to attenuate the charge of the second set of capacitors.

18. The delta-sigma ADC of claim 17, wherein the logic circuit to control switch operation during a conversion phase is configured to:
   combine a charge of the first set of capacitors that represents a sampled analog input signal with the combined charge of the charge pump and charge of the second set of capacitors to generate a subsequent combination of charge; and
   control the SAR DAC and the ELDC DAC to perform a number of bit-trials of a conversion on the subsequent combination of charge.

19. The delta-sigma ADC of claim 15, the logic circuit to receive a calibration signal and, in response, control switch operation to:
   determine, with the analog input signal set to a reference voltage, a first ELD digital output calibration signal where the ELDC control signal is set to a first code value, and a second ELD digital output calibration signal where the ELDC control signal is set to a second code value; and
   determine a charge pump control code based on the first ELD digital output calibration signal and the second ELD digital output calibration signal, wherein the charge pump control code programs the capacitance of the charge pump.

20. The delta-sigma ADC of claim 15, wherein the charge pump is coupled to the first set of capacitors, and wherein the programmable capacitance adjusts the gain of the SAR DAC.

* * * * *